(12) United States Patent
Okuta et al.

(10) Patent No.: US 12,379,398 B2
(45) Date of Patent: Aug. 5, 2025

(54) MEASUREMENT SYSTEM

(71) Applicant: Kabushiki Kaisha Nihon Micronics, Tokyo (JP)

(72) Inventors: Michitaka Okuta, Tokyo (JP); Toshinaga Takeya, Aomori (JP); Hisao Narita, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 428 days.

(21) Appl. No.: 17/483,150

(22) Filed: Sep. 23, 2021

(65) Prior Publication Data

US 2022/0196570 A1 Jun. 23, 2022

(30) Foreign Application Priority Data

Dec. 21, 2020 (JP) .................. 2020-210963

(51) Int. Cl.
 *G01R 1/073* (2006.01)
 *G01N 21/95* (2006.01)
 (Continued)

(52) U.S. Cl.
 CPC ......... *G01R 1/073* (2013.01); *G01N 21/9501* (2013.01); *G01R 1/071* (2013.01); *G01R 31/2635* (2013.01)

(58) Field of Classification Search
 CPC ......... G01N 21/954; G01N 2021/9546; G01N 21/66; G01N 21/9501; G01N 2021/95638; G01N 21/17; G01R 1/073; G01R 1/071; G01R 1/0491; G01R 31/2601; G01R 1/07392; G01R 31/2656; G01R 31/26; G01R 31/2632–2635; G01R 31/2642; G01R 31/27; G01R 31/275; G01R 31/308;
(Continued)

(56) References Cited

U.S. PATENT DOCUMENTS 4,808,815 A   2/1989 Langley
8,823,406 B2 * 9/2014 Bolt ............... G01J 1/0242
                                          356/73
(Continued)

FOREIGN PATENT DOCUMENTS

CN  201141906 Y  10/2008
CN  101770967 A   7/2010
(Continued)

OTHER PUBLICATIONS

English translation of KR-10-2011-0129283, published Dec. 1, 2011. (Year: 2011).*

*Primary Examiner* — Christina A Riddle
(74) *Attorney, Agent, or Firm* — Lorenz & Kopf, LLP

(57) ABSTRACT

A measurement system includes a drive device configured to drive the plurality of optical semiconductor elements, a probe unit including a plurality of optical connection devices configured to receive respective emitted lights from the plurality of optical semiconductor elements and a processing device including a plurality of photoelectric converters. Each of the optical connection devices is connected to each of the photoelectric converter, and at least some of the emitted lights received by the optical connection devices are input to the photoelectric converter. The photoelectric converter converts the input emitted lights into electric signals.

7 Claims, 8 Drawing Sheets

(51) Int. Cl.
*G01R 1/07* (2006.01)
*G01R 31/26* (2020.01)

(58) Field of Classification Search
CPC ....... H01L 22/30; H01L 22/24; H01L 31/042;
G02B 27/42
USPC ... 356/432, 433, 434, 435, 237.1–237.6, 73,
356/213–236; 324/500, 501, 511, 512,
324/527, 537, 750.01, 750.2, 750.12,
324/750.15, 750.23, 750.24, 754.01,
324/754.03, 754.23, 755.01, 755.11,
324/757.2–757.5, 762.01–762.7, 556
See application file for complete search history.

(56) References Cited

U.S. PATENT DOCUMENTS

| | | | | |
|---|---|---|---|---|
| 9,040,896 | B2* | 5/2015 | Walker | G01J 1/0425 |
| | | | | 250/208.2 |
| 9,127,979 | B2* | 9/2015 | Cheng | G01J 1/0204 |
| 2011/0267087 | A1* | 11/2011 | Huang | G09G 3/006 |
| | | | | 324/762.01 |
| 2021/0148835 | A1* | 5/2021 | Okuta | G01R 31/308 |
| 2022/0034714 | A1* | 2/2022 | Okuta | G01J 1/0425 |

FOREIGN PATENT DOCUMENTS

| | | | |
|---|---|---|---|
| JP | S6064443 A | | 4/1985 |
| JP | S6231136 A | | 2/1987 |
| JP | S641925 A | | 1/1989 |
| JP | H03133183 A | | 6/1991 |
| JP | 2015226008 A | | 12/2015 |
| KR | 10-2011-0129283 | * | 12/2011 |

* cited by examiner

| ITEM | TIME | TOTAL |
| --- | --- | --- |
| FORWARD VOLTAGE Vf | 10 MSEC × 2 | 20 MSEC |
| OPTICAL OUTPUT (IL) PROPERTY | 13 MSEC × 2 | 26 MSEC |
| SPECTRAL PROPERTY | 2 MSEC × 64 | 128 MSEC |
| REVERSE CURRENT Ir | 10 MSEC × 1 | 10 MSEC |
| SLEEP TIME | 100 MSEC × 4 | 400 MSEC |
| TOTAL MEASUREMENT TIME | – | 574 MSEC |

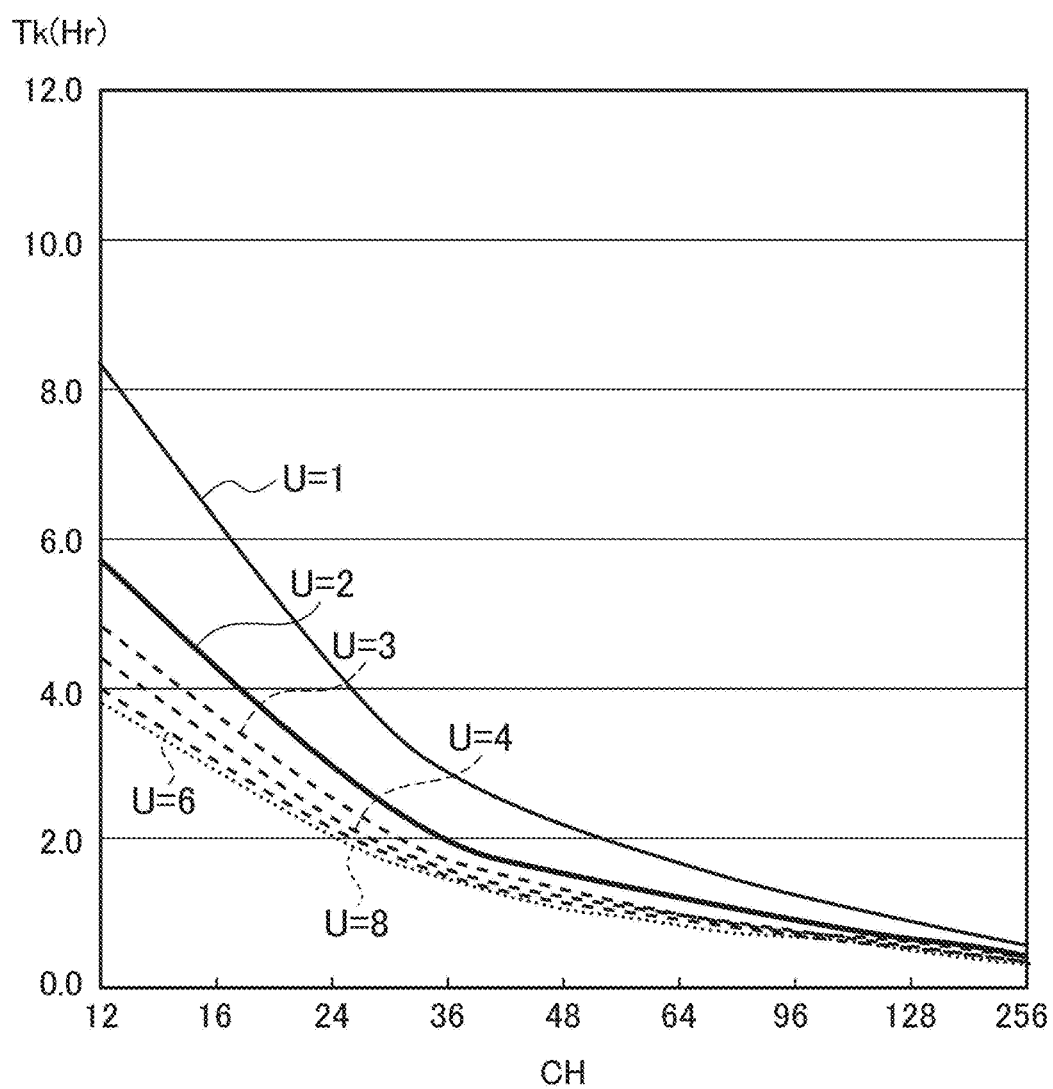

MEASUREMENT SYSTEM

CROSS-REFERENCE TO PRIORITY APPLICATION

This application is based upon and claims the benefit of priority from prior Japanese Patent Application P2020-210963, filed on Dec. 21, 2020; the entire contents of which are incorporated by reference herein.

TECHNICAL FIELD

Embodiments described herein relate generally to a measurement system used for measuring the properties of optical semiconductor elements.

BACKGROUND

Optical semiconductor elements are formed on a semiconductor substrate such as a wafer by using silicon photonics technology. The optical semiconductor elements use electric signals and optical signals as input/output signals. In order to measure the properties of the optical semiconductor elements formed on the semiconductor substrate, a measurement system including electric probes for propagating electric signals and optical probes for propagating optical signals is used. For example, the electric probes made of conductive material, and the optical probes including optical fibers or a combination of lenses and optical fibers are used to measure the optical semiconductor elements.

For example, the optical semiconductor elements formed on the semiconductor substrate are driven by supplying driving currents from the electric probes. The emitted lights from the driven optical semiconductor elements are received by the optical probes. In this measurement method, a measurement system is used in which one each of emitted lights from the optical semiconductor elements is propagated to a measurement device.

However, it is difficult to measure one each of all of thousands to hundreds of thousands of the optical semiconductor elements formed on the semiconductor substrate, because the total measurement time becomes longer. In addition, when all the optical semiconductor elements formed on the semiconductor substrate cannot be measured, it is not sufficient to determine whether each of the optical semiconductor elements is non-defective or defective, reducing a yield rate on the products in the subsequent process.

BRIEF SUMMARY

A measurement system according to one aspect of the present invention includes a drive device configured to drive the plurality of optical semiconductor elements, a probe unit including a plurality of optical connection devices configured to receive respective emitted lights from the plurality of optical semiconductor elements, and a processing device including a plurality of photoelectric converters. Each of the optical connection devices is connected to each of the photoelectric converters, and at least some of the emitted lights received by the optical connection devices are input to the photoelectric converter. The photoelectric converter converts the input emitted lights into electric signals.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 11 is a graph showing the relationship between the number of units and measurement time of the measurement system according to the embodiment.

DETAILED DESCRIPTION

Figure 1:
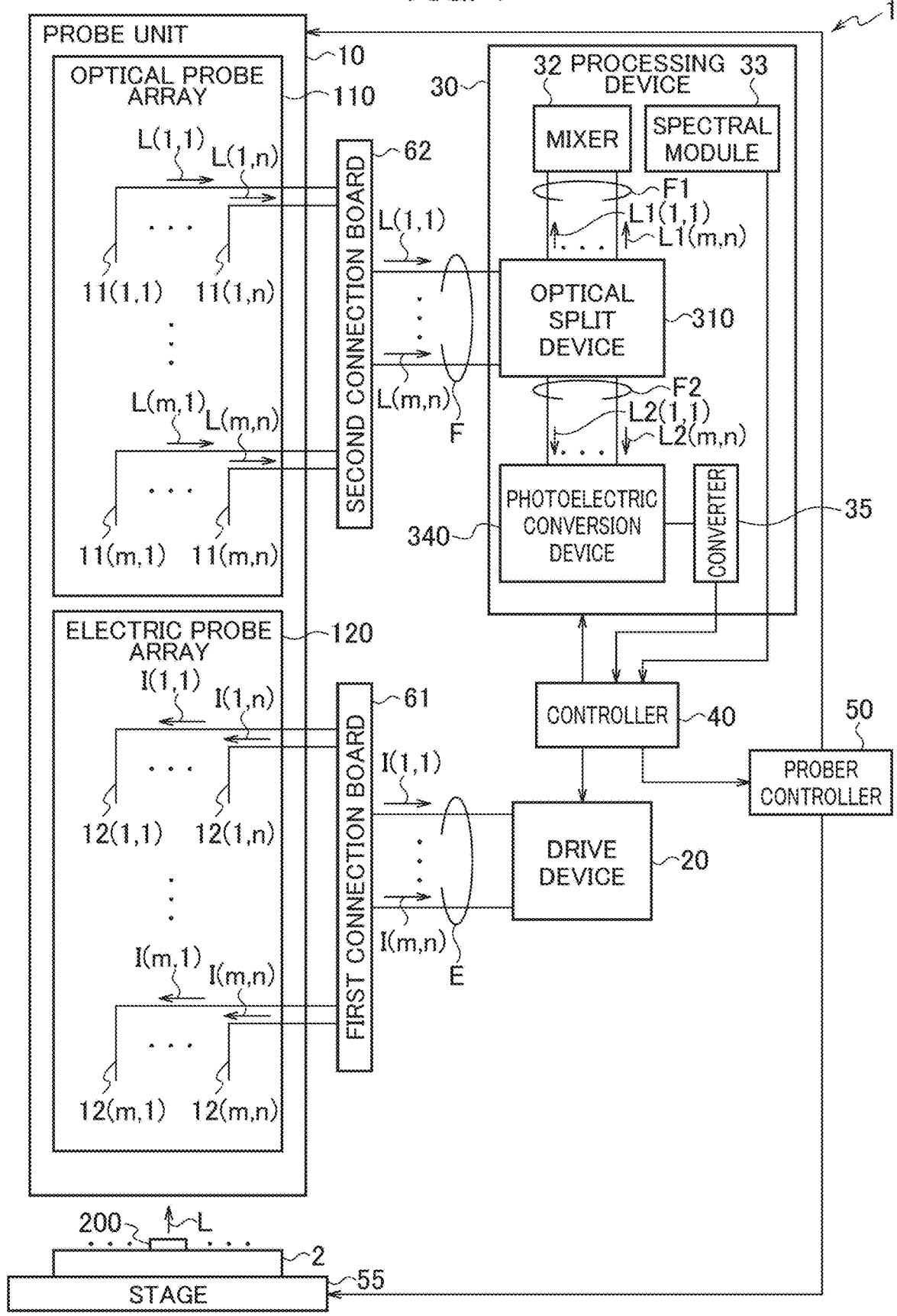
FIG. 1 is a schematic view showing a configuration of a measurement system according to a first embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this invention, and the embodiments of this invention do not specify materials, shapes, structures, dispositions and the like of constituent components to those described below.

First Embodiment

A measurement system 1 according to a first embodiment of the present invention is shown in FIG. 1. The measurement system 1 measures the properties of optical semiconductor elements 200 formed on a main surface of a semiconductor substrate 2. The measurement system 1 includes a probe unit 10 arranged opposite to the optical semiconductor elements 200, a drive device 20 for driving the optical semiconductor elements 200, and a processing device 30 for processing emitted lights from the optical semiconductor elements 200. The measuring system 1 measures the properties of the optical semiconductor elements 200 with the semiconductor substrate 2 mounted on a stage 55.

The measurement system 1 further includes a controller 40 and a prober controller 50. The prober controller 50 adjusts the positions of the probe unit 10 and the stage 55. The controller 40 controls the entire operation of the measurement system 1. For example, the drive device 20, the processing device 30, and the prober controller 50 operate in response to control signals from the controller 40. The control device 40 also has a function of processing data of the emitted lights, which are obtained by the processing device 30, from the optical semiconductor elements 200, and calculating the properties of the optical semiconductor elements 200. The controller 40 may be a personal computer (PC), for example.

As will be described later, in the measurement system 1, the optical output (IL) properties, and photoelectric properties such as forward voltage Vf and reverse current Ir are simultaneously measured with respect to the plurality of optical semiconductor elements 200. Meanwhile, in the measurement system 1, the spectral property of one each of the optical semiconductor elements 200 is measured. Hereinafter, the measurement performed simultaneously with respect to the plurality of optical semiconductor elements 200 is referred to as "parallel measurement". The measurement performed in order with respect to one each of the optical semiconductor elements 200 is referred to as "serial measurement".

As shown in FIG. 1, the probe unit 10 is provided with an optical probe array 110 including optical probes 11 (1, 1) to 11 (m, n). Hereinafter, the optical probe 11 (1, 1) to the optical probe 11 (m, n) are also referred to as "optical probe 11". The tips of the optical probe 11 are optically connected to optical signal terminals of the optical semiconductor elements 200. In the measurement system 1, the optical probe 11 is used as an optical connection device for receiving emitted lights from the optical semiconductor elements 200.

For example, the optical probe array 110 has a configuration in which the tips of the "m×n" number of optical probes 11 are arranged in a matrix of m rows and n columns when viewed from the surface-normal direction in the main surface of the semiconductor substrate 2 (referred to below as "planar view"). In this case, the optical probe array 110 may be configured by arranging multicore probes having n-cores in m columns.

Further, the probe unit 10 is provided with an electric probe array 120. The electric probe array 120 includes electric probes 12 (1, 1) to 12 (m, n) arranged corresponding to the optical probes 11 (1, 1) to 11 (m, n), respectively. Hereinafter, the electric probe 12 (1, 1) to the electric probe 12 (m, n) are also referred to as "electric probe 12". The tips of the electric probe 12 are electrically connected to electric signal terminals of the optical semiconductor elements 200.

The arrangement of the optical semiconductor elements 200 formed on the semiconductor substrate 2 corresponds to the arrangement of the optical probes 11 and the electric probes 12. For example, when the tips of the "m×n" number of optical probes 11 are arranged in a matrix of m rows and n columns, the electric probe array 120 is configured so that the tips of the "m×n" number of electric probes 12 are arranged in a matrix of m rows and n columns.

The arrangement pitch of the optical semiconductor elements 200 is matched with the arrangement pitch of the optical probes 11 and the electric probes 12. Thus, the "m×n" number of optical semiconductor elements 200, the "m×n" number of optical probes 11 and the "m×n" number of electric probes 12 are simultaneously aligned by the alignment of the optical probe array 110 and the semiconductor substrate 2. A set of the optical probe 11 and the electric probe 12 connected to the same optical semiconductor element 200 is referred to below as "probe set".

In the measurement system 1 shown in FIG. 1, one probe set corresponding to one optical semiconductor element 200 is constituted by one optical probe 11 and one electric probe 12. However, the number of optical probes 11 and electric probes 12 constituting one probe set may be more than one. For example, for one optical semiconductor element 200, the electric probe 12 for supplying driving currents to the optical semiconductor element 200 and a GND electric probe 12 connected to a ground terminal of the optical semiconductor element 200 may be used. In this way, the number of the optical probes 11 and the electric probes 12 arranged for one optical semiconductor element 200 may be arbitrarily set in accordance with a specification of the optical semiconductor element 200.

In the measurement of the optical semiconductor elements 200 by the measurement system 1, firstly, the optical semiconductor elements 200 and the probe unit 10 are aligned. By the alignment of the optical semiconductor elements 200 and the probe unit 10, the optical signal terminals of the optical semiconductor elements 200 are optically connected to the optical probe 11. At the same time, the electric signal terminals of the optical semiconductor elements 200 are electrically connected to the electric probe 12.

With the optical semiconductor elements 200 and the probe unit 10 aligned, the drive device 20 supplies a drive current I (1, 1) to a drive current I (m, n) to the electric probe 12 (1, 1) to the electric probe 12 (m, n). Hereinafter, the drive current I (1, 1) to the drive current I (m, n) are also referred to as "drive current I". From the drive device 20, the drive currents I propagate through an electric wiring E. The electric wiring E is a set of a plurality of electric wirings through which the drive current I propagates. The drive current I is supplied from the drive device 20 to the optical semiconductor elements 200 via a first connection board 61 disposed between the probe unit 10 and the drive device 20.

Figure 2:
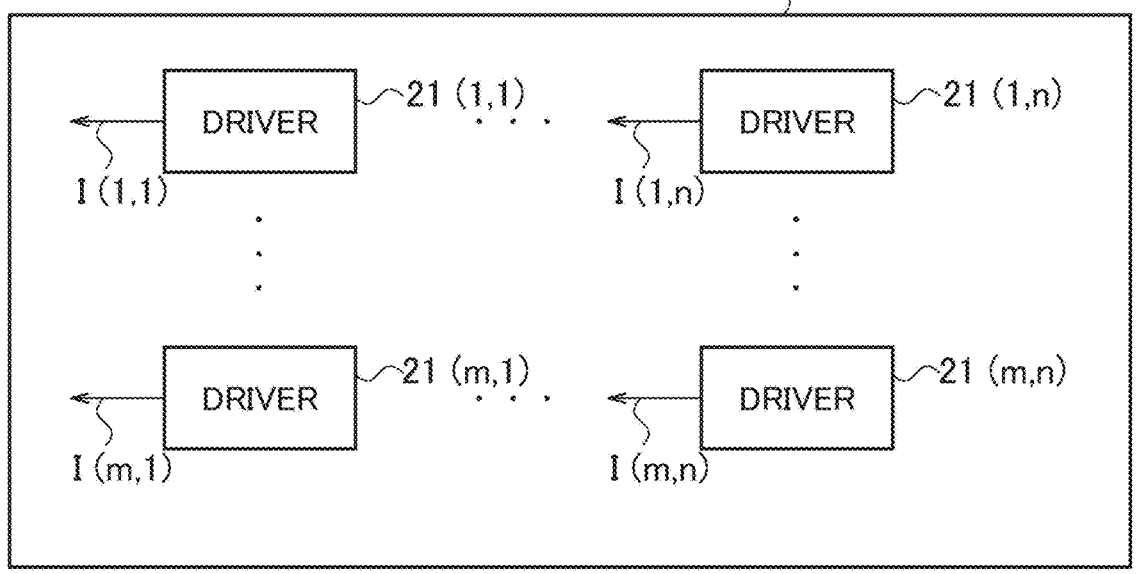
FIG. 2 is a schematic view showing a configuration example of a drive device of the measurement system according to the first embodiment.

For example, the drive device 20, as shown in FIG. 2, includes the "m×n" number of drivers 21 (1, 1) to 21 (m, n) each connected to the "m×n" number of electric probes 12. Each of the driver 21 (1, 1) to the driver 21 (m, n) corresponds to each of the electric probe 12 (1, 1) to the electric probe 12 (m, n). Hereinafter, the driver 21 (1, 1) to the driver 21 (m, n) are also referred to as "driver 21". The drive device 20 supplies the drive currents I to each of the optical semiconductor elements 200 from the drivers 21 via the electric probes 12.

In the measurement system 1, the controller 40 outputs control signals for supplying the drive currents I to the optical semiconductor elements 200 to the drive device 20. The drivers 21 of the drive device 20 which have received the control signals supply the drive currents I to the optical semiconductor elements 200 to which each of the drivers 21 is connected. For example, the controller 40 outputs serial control signals, which are converted into parallel control signals and transmitted to each of the drivers 21.

The drive currents I supplied from the electric probes 12 energize the optical semiconductor elements 200. Then, the emitted lights from the energized optical semiconductor elements 200 are received by the optical probes 11 constituting the probe set with the electric probes 12 to which the drive currents I are supplied.

In the parallel measurement, the "m×n" number of optical semiconductor elements 200 are energized simultaneously. At this time, each of the emitted lights from the "m×n" number of optical semiconductor elements 200 is received by each of the "m×n" number of optical probes 11. Each of the emitted lights received by the optical probe 11 (1, 1) to the optical probe 11 (m, n) is defined as an emitted light L (1, 1) to an emitted light L (m, n). The emitted light L (1, 1) to the emitted light L (m, n) are also referred to as "emitted light L". The emitted light L is input to an optical split device 310 of the processing device 30 via a second connection board 62 and an optical wiring F. The optical wiring F is a set of a plurality of optical wirings through which each of the emitted lights L propagates.

The optical split device 310 splits each of the emitted light L (1, 1) to the emitted light L (m, n), which is received by the optical probe 11 (1, 1) to the optical probe 11 (m, n), into a first split light L1 (1, 1) to a first split light L1 (m, n) and a second split light L2 (1, 1) to a second split light L2 (m, n). The first split light L1 (1, 1) to the first split light L1 (m, n) are also referred to as "first split light L1". The second split light L2 (1, 1) to the second split light L2 (m, n) are also referred to as "second split light L2". The first split light L1 propagates through the optical wiring F1 from the optical split device 310 and are input to a mixer 32. The optical wiring F1 is a set of a plurality of optical wirings through which each of the first split lights L1 propagates. Further, the second split light L2 propagates through the optical wiring F2 from the optical split device 310 and are input to a photoelectric conversion device 340. The optical wiring F2 is a set of a plurality of optical wirings through which each of the second split lights L2 propagates.

Figure 3:
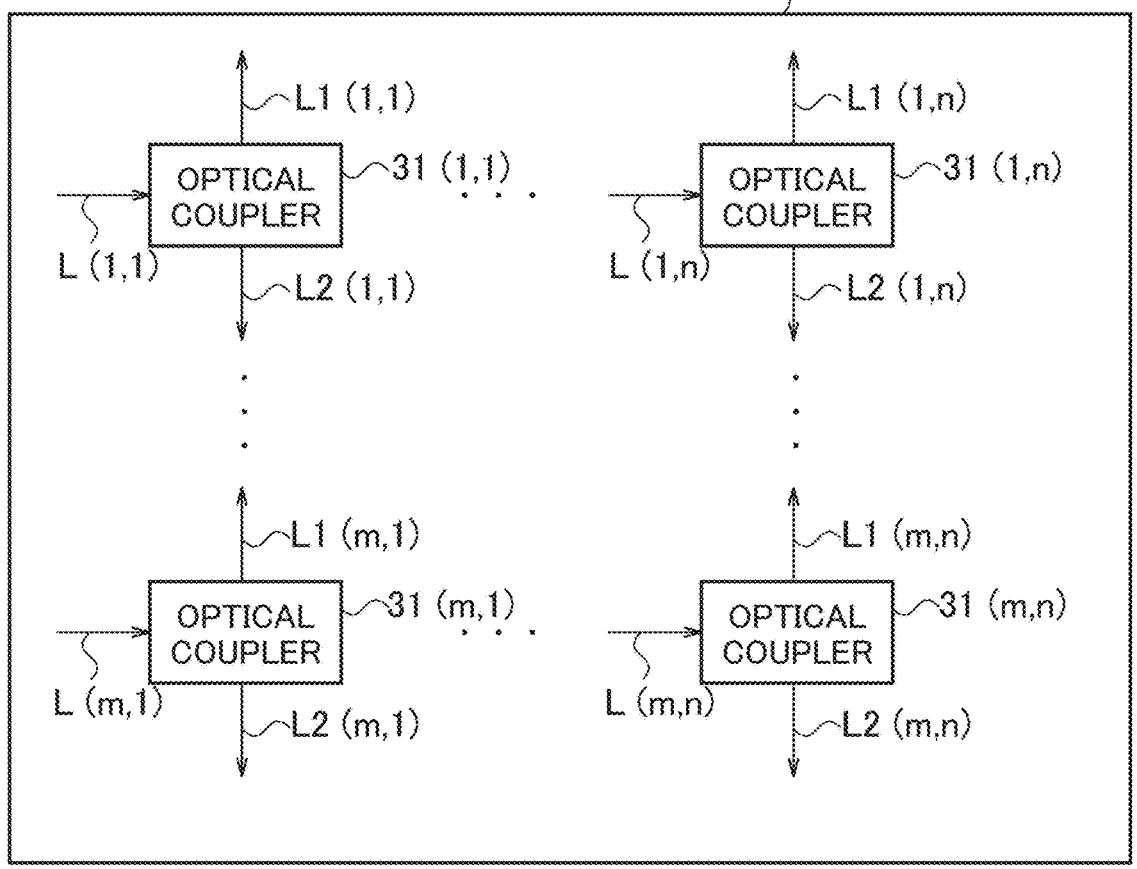
FIG. 3 is a schematic view showing a configuration example of an optical split device of the measurement system according to the first embodiment.

For example, the optical split device 310, as shown in FIG. 3, includes the "m×n" number of optical couplers 31 (1, 1) to 31 (m, n). Each of the optical coupler 31 (1, 1) to the optical coupler 31 (m, n) corresponds to each of the optical probe 11 (1, 1) to the optical probe 11 (m, n). The optical coupler 31 (1, 1) to the optical coupler 31 (m, n) divide (split) each of the emitted lights L, which is received the optical probe 11 (1, 1) to the optical probe 11 (m, n), into the first split light L1 and the second split light L2. Hereinafter, the optical couplers 31 (1, 1) to 31 (m, n) are also referred to as "optical coupler 31".

The second connection board 62 includes a multicore adapter having the "m×n" number of connectors, for example. The optical probes 11 and the optical couplers 31 are optically connected through a connector of the second connection board 62. The second connection board 62 can be, for example, a multiple array type or a multiple core connector type.

As described below, the first split light L1 is used for serial measurement. The second split light L2 is used for parallel measurement. For example, the first split light L1 is about 10% of the emitted lights L, and the second split light L2 is about 90% of the emitted lights L.

The first split lights L1 are used for measuring the spectral properties of the emitted lights L from the optical semiconductor elements 200. Specifically, the first split lights L1 of the "m×n" number of emitted lights L received by the "m×n" number of optical probes 11 are input to the input terminals of the mixer 32 having the "m×n" number of input terminals and one output terminal. In serial measurement, as will be described later, each of the first split lights L1 sequentially input to the mixer 32 is outputted from the output terminal of the mixer 32 to a spectral module 33. The spectral module 33 resolves each of the input first split lights L1.

For example, an optical waveguide type structure including Y splits can be suitably used for the mixer 32. The mixer 32 of this structure has a compact shape and is easy to handle with little loss when used as a mixer. Alternatively, a fusion-extension type optical coupler having one-input and two-split-outputs may be fusion-connected in multiple stages to constitute the mixer 32.

When the spectral property of the emitted light L is measured by resolving the first split light L1 with the spectral module 33, the controller 40 selects one each of the optical semiconductor elements 200 to be driven. For example, the controller 40 sequentially selects the drivers 21 that supply the drive currents I to the optical semiconductor elements 200. The first split light L1 of the emitted light L from the optical semiconductor element 200 driven by the selected driver 21 is outputted from the mixer 32. The first split light L1 outputted from the mixer 32 is input to the spectral module 33. The spectral module 33 resolves the first split light L1 and transmits the resolved data to the controller 40. Thus, the spectral property of the selected optical semiconductor element 200 is measured. When the controller 40 selects one each of the optical semiconductor elements 200, the spectral properties of the "m×n" number of optical semiconductor elements 200 are sequentially measured.

As described above, each of the first split lights L1 of the emitted lights L received by each of the optical probes 11 is resolved by the spectral module 33. Thus, the measurement of the spectral property by the spectral module 33 is the serial measurement. The spectral properties obtained by the spectral module 33 are stored into a storage device connected to the controller 40 in association with the optical semiconductor elements 200.

The second split lights L2 split from the emitted lights L are subjected to optical signal/electric signal conversion (OE conversion), and used for measuring the photoelectric properties such as the optical output (IL) properties, forward voltage Vf and reverse current Ir about the emitted lights L of the optical semiconductor elements 200. More specifically, the second split lights L2 of the "m×n" number of emitted lights L from the "m×n" number of optical probes 11 are input to the photoelectric conversion device 340 of the processing device 30. The photoelectric conversion device 340 performs OE conversion on each of the "m×n" number of second split lights L2.

Figure 4:
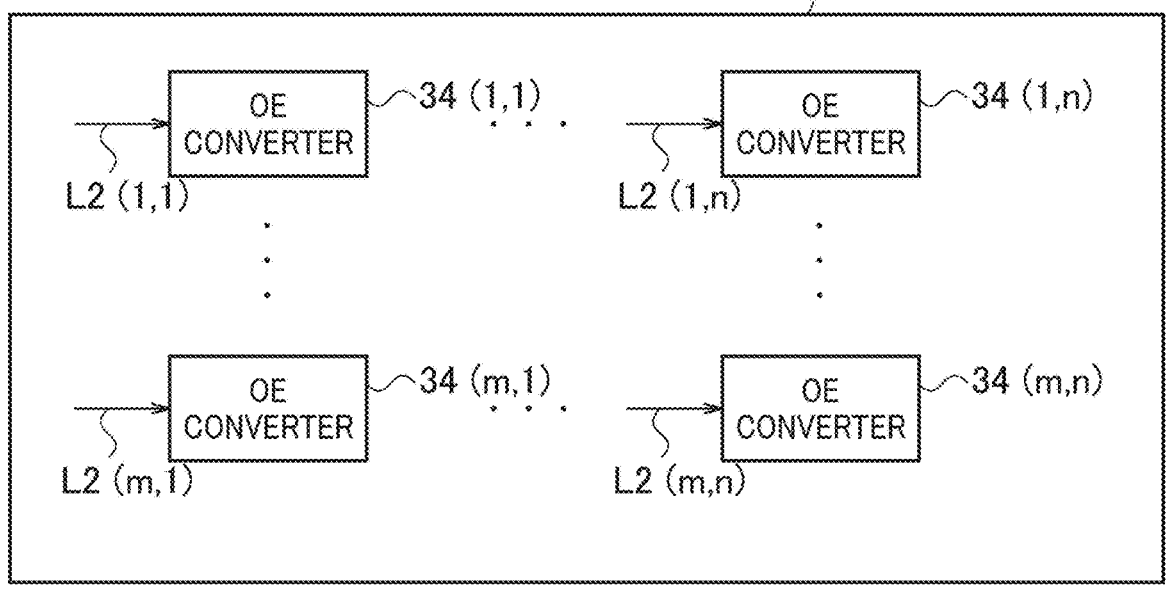
FIG. 4 is a schematic view showing a configuration example of a photoelectric conversion device of the measurement system according to the first embodiment.

The photoelectric conversion device 340 includes a plurality of photoelectric converters (OE converters) each corresponding to one of the optical probes 11. Each of the OE converters receives each of the second split lights L2 of the emitted lights L received by the optical probes 11. For example, as shown in FIG. 4, the photoelectric converter 340 includes the "m×n" number of OE converters 34 (1, 1) to 34 (m, n) each optically connected to each of the "m×n" number of optical probes 11. Hereinafter, the OE converter 34 (1, 1) to the OE converter 34 (m, n) are also referred to as "OE converter 34". The optical probe 11 and the OE converter 34 are optically connected through the optical coupler 31. At least some of the emitted lights L received by each of the optical probes 11 are input to the OE converter 34 as the second split lights L2. The OE converter 34 converts the second split lights L2 into the electric signals.

The electric signals converted from the second split lights L2 by the photoelectric converter 340 are analog-to-digital (AD) converted by a converter 35. Further, the converter 35 performs parallel/serial conversion on the "m×n" number of electric signals that have been digitally converted. The serially converted data is transmitted to the controller 40, and the properties of the optical semiconductor elements 200 are acquired and sequentially stored. For example, when the controller 40 processes the data of the drive currents I and the second split lights L2, the photoelectric properties such as the optical output (IL) properties, the forward voltage Vf and the reverse current Ir of the optical semiconductor elements 200 are measured.

As described above, the measurement using the photoelectric conversion device 340 is a parallel measurement in which the "m×n" number of optical semiconductor elements 200 are simultaneously energized and the emitted lights L from the "m×n" number of optical semiconductor elements 200 are processed. The plurality of OE converters 34 simultaneously process emitted lights L from the plurality of optical semiconductor elements 200. The properties obtained by the parallel measurement are stored into the storage device connected to the controller 40 in association with the optical semiconductor elements 200.

Figure 5:
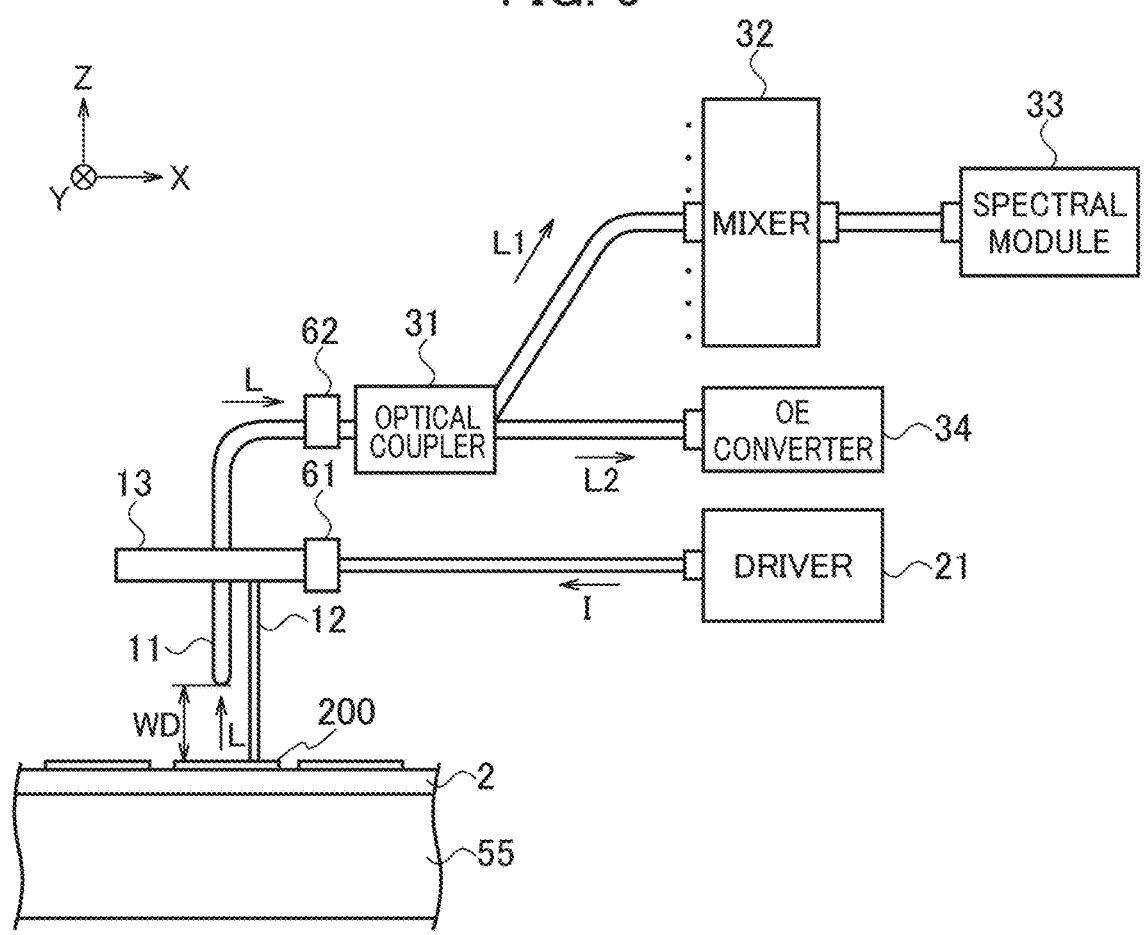
FIG. 5 is a schematic view partially showing a configuration of the measurement system according to the first embodiment.

FIG. 5 shows a part of a measurement system for one optical semiconductor element 200 using the measurement system 1. By the alignment of the optical semiconductor element 200 and the probe unit 10, the electric probe 12 is connected to an electric signal terminal (illustration omitted) of the optical semiconductor element 200. At this time, a working distance WD between the tip of the optical probe 11 and the optical signal terminal (illustration omitted) of the optical semiconductor element 200 is set to a distance where the optical probe 11 and the optical signal terminal of the optical semiconductor element 200 are optically connected. Since the electric probe 12 has elasticity, it is possible to adjust the working distance WD by several tens of µm while the electric probe 12 is connected to the optical semiconductor element 200. The optical probe 11 and the electric probe 12 are supported on a probe fixing part 13 of the probe unit 10, which fixes the positions of the optical probe 11 and the electric probe 12. The optical probe 11 and the electric probe 12 may be fixed and supported by separate probe fixing parts 13.

In the alignment of the optical semiconductor element 200 and the probe unit 10, for example, the probe unit 10 moves in an XY plane parallel to the main surface of the semiconductor substrate 2 and in a Z direction perpendicular to the main surface of the semiconductor substrate 2 under the control of a prober controller 50. Alternatively, under the control of the prober controller 50, the stage 55 moves in the XY plane and the Z direction with the semiconductor substrate 2 mounted thereon. The stage 55 is rotatable about the Z direction. The optical probe 11 and the electric probe 12 can be aligned with respect to the optical semiconductor elements 200, for example, in units of several µm.

The tip of the optical probe 11 where the emitted light L from the optical semiconductor element 200 enters is made of, for example, a multimode fiber or a single mode fiber. The tip of the optical probe 11 may be shaped into a spherical shape. By forming the tip of the optical probe 11 into a spherical shape, it is possible to handle the adjustment of a numerical aperture NA at the tip of the optical probe 11, the adjustment of the working distance WD and the reduction of a reflected return light of the emitted light L from the tip of the optical probe 11. As a result, the emitted light L can be stably received at the tip of the optical probe 11.

In the state shown in FIG. 5, for example, the driver 21 outputs the drive current I which is a direct current or a pulse current with several microseconds to several tens of microseconds. The drive current I is supplied to the optical semiconductor element 200 via the first connection board 61 and the electric probe 12. The optical semiconductor element 200 supplied with the drive current I emits the emitted light L. The optical probe 11 receives the emitted light L from the optical semiconductor element 200. The emitted light L propagated through the optical probe 11 is propagated to the optical coupler 31 via the second connection board 62. The optical coupler 31 splits the emitted light L into the first split light L1 and the second split light L2. The first split light L1 is input to the spectral module 33 via the mixer 32. The second split light L2 is input to the OE converter 34.

As described above, the measurement system 1 includes the "m×n" number of OE converters 34 each connected to each of the "m×n" number of optical probes 11, and the m×n number of drivers 21 each connected to each of the "m×n" number of electric probes 12. Thus, the measurement system 1 makes it possible to perform the parallel measurement for simultaneously measuring the "m×n" number of optical semiconductor elements 200, and the serial measurement for sequentially measuring one each of the optical semiconductor elements 200.

Figure 6:
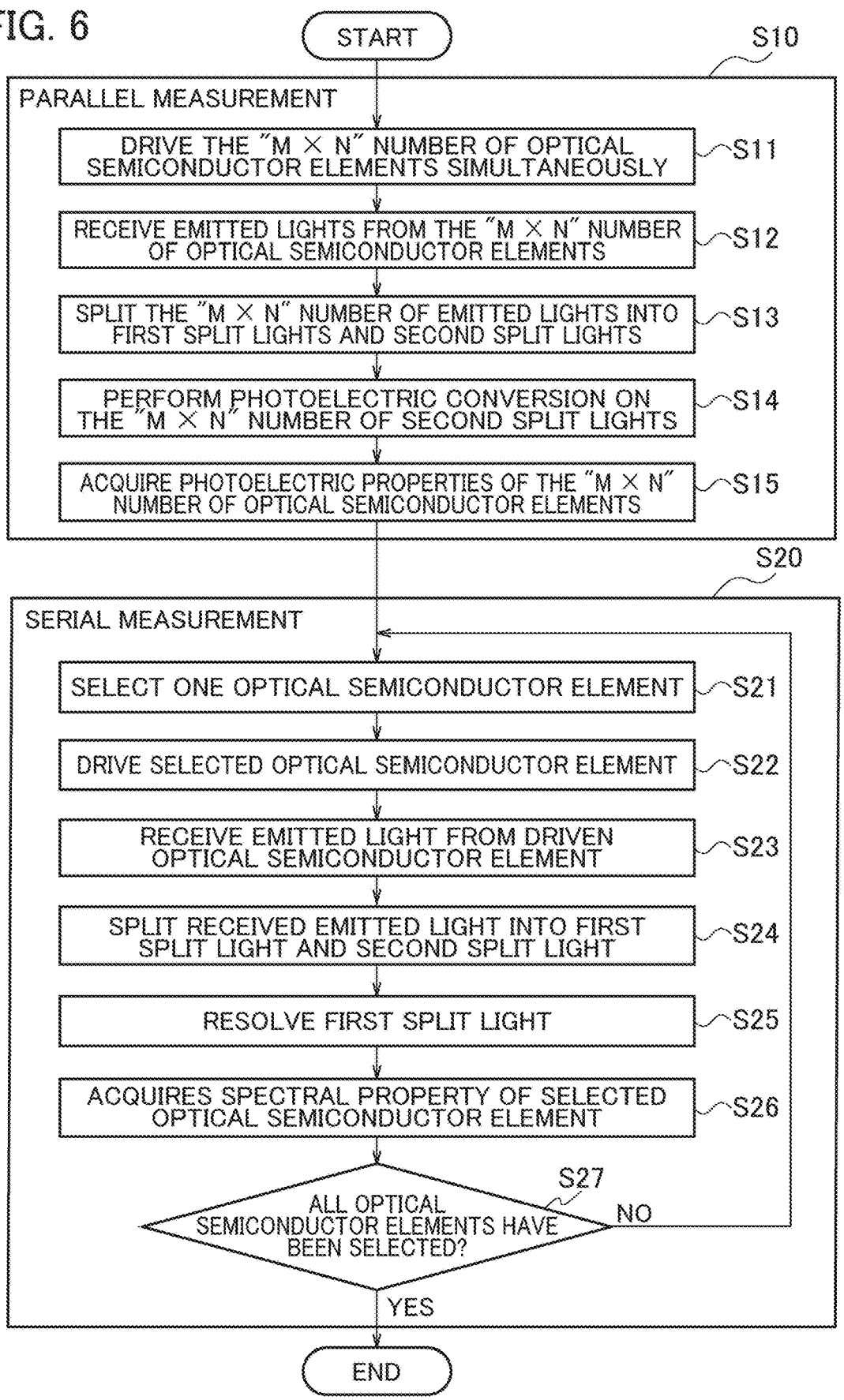
FIG. 6 is a flowchart for explaining a measurement method using the measurement system according to the first embodiment.

Referring to FIG. 6, an example of a method of measuring the "m×n" number of optical semiconductor elements 200 by the measurement system 1 will be described below. FIG. 6 illustrates a case where the serial measurement shown in step S20 is performed after the parallel measurement shown in step S10 is performed.

First, in step 11 of step 10, the drive device 20 drives the "m×n" number of optical semiconductor elements 200 simultaneously. In step 12, the optical probes 11 receives the emitted lights L from the optical semiconductor elements 200. In step 13, the optical split device 310 splits each of the "m×n" number of emitted lights L received by the optical probes 11 into the first split lights L1 and the second split lights L2.

In step 14, the photoelectric conversion device 340 simultaneously performs photoelectric conversion on the "m×n" number of second split lights L2. The electric signals converted from the second split lights L2 by photoelectric conversion are transmitted to the controller 40 via the converter 35.

In step 15, the controller 40 acquires the photoelectric properties of the "m×n" number of optical semiconductor elements 200 using the drive currents I supplied to the optical semiconductor elements 200 and the electric signals obtained from the second split lights L2. For example, by using the data of the drive currents I and the second split lights L2, the optical output (IL) properties, the forward voltage Vf and the reverse current Ir of the optical semiconductor element 200 are acquired.

Next, in step 21 of step 20, the controller 40 selects one optical semiconductor element 200. In step 22, the drive device 20 supplies the drive current I to the selected optical semiconductor element 200 to drive the optical semiconductor element 200. In step 23, the optical probe 11 receives the emitted light L from the driven optical semiconductor element 200. In step 24, the optical split device 310 splits the emitted light L received by the optical probe 11 into the first split light L1 and the second split light L2.

In step 25, the first split light L1 input to the spectral module 33 via the mixer 32 is resolved by the spectral module 33. The wavelength property data resolved by the spectral module 33 is transmitted to the controller 40. In step 26, the controller 40 acquires the spectral property of the selected optical semiconductor element 200 using the wavelength property data resolved by the spectral module 33.

In step 27, the controller 40 determines whether all the "m×n" number of optical semiconductor elements 200 have been selected. If there is an unselected optical semiconductor element 200, the process returns to step 21. If all the optical semiconductor elements 200 have been selected, the process ends.

The measurement of the spectral properties of the optical semiconductor elements 200 is repeated "m×n" times. Therefore, the shorter the measurement time by the spectral module 33 is, the shorter the time required for the serial measurement is. For this reason, it is preferable for the spectral module 33 to have an appropriate wavelength resolution, a short light-receiving integration time in units of milliseconds, and a fast transfer rate of measurement data so as to shorten the measurement time.

In the above description, after simultaneously measuring the photoelectric properties of the "m×n" number of optical semiconductor elements 200 by the parallel measurement, one each of the spectral properties of the "m×n" number of optical semiconductor elements 200 is sequentially measured by the serial measurement. However, in the measurement by the measurement system 1, an order of the parallel measurement and serial measurement can be arbitrarily set. For example, the parallel measurement may be performed after the serial measurement. In addition, the serial measurement may be performed during the parallel measurement. That is, the order of measurement for the properties measured by the parallel measurement and the properties measured by the serial measurement can be arbitrarily set.

In order to measure all the optical semiconductor elements 200 formed on the semiconductor substrate 2, the semiconductor substrate 2 or the probe unit 10 is moved to measure the unmeasured optical semiconductor elements 200 every time the measurement of the "m×n" number of optical semiconductor elements 200 is completed. The measurement of the optical semiconductor elements 200 described with reference to FIG. 6 is repeated until the measurement of all the optical semiconductor elements 200 formed on the semiconductor substrate 2 is completed.

According to the measurement system 1, by repeating the measurement of the "m×n" number of optical semiconductor elements 200, it is possible to efficiently measure all the optical semiconductor elements 200 formed on the semiconductor substrate 2. Hereinafter, the number of the optical semiconductor elements 200 that can be simultaneously measured by the measurement system 1 is also referred to as "number of channels" of the measurement system 1. The number of channels of the measurement system 1 shown in FIG. 1 is "m×n".

When the total number of the optical semiconductor elements 200 formed on the semiconductor substrate 2 is the Nw-number, the number of times for repeating the measurement of the "m×n" number of optical semiconductor elements 200 is approximately Nw/the number of channels at the minimum. In the measurement by the measurement system 1, the time required for measuring all the optical semiconductor elements 200 formed on the semiconductor substrate 2 can be greatly shortened in comparison with the measurement in which the optical probe 11 and the electric probe 12 are aligned for one each of the optical semiconductor elements 200.

It should be noted that there may be a configuration in which the "m×n" number of spectral modules 33 corresponding to the "m×n" number of optical semiconductor elements 200 are prepared in the processing device 30. However, such a configuration is inefficient due to a large increase in cost and mounting space. According to the measurement system 1 shown in FIG. 1, the measurement time can be shortened by multi-channel measurement with a simple circuit configuration and efficient operation.

Hereinafter, the measurement time of the optical semiconductor elements 200 by the measurement system 1 will be described below. Here, the alignment time between the probe unit 10 and the semiconductor substrate 2 is represented by tp, the time required for parallel measurement is represented by tm, and the time required for serial measurement of the "m×n" number of optical semiconductor elements 200 is represented by tb. In this case, the total measurement time Tk1 required for the measurement of the "m×n" number of optical semiconductor elements 200 by the measurement system 1 is expressed by the following equation (1):

$$Tk1 = tp + tm + tb \quad (1)$$

When the measurement time of one optical semiconductor element 200 in the serial measurement is ts, tb=ts×(m×n).

In the parallel measurement performed with respect to a plurality of measurement items, the time (referred to below as "sleep time tr") for stopping the supply of the drive currents I to the optical semiconductor elements 200 may be provided between the measurement items in order to dissipate heat from the optical semiconductor elements 200. In this case, tm=tl+tr, where tl is the time during which the drive currents I are supplied to the optical semiconductor elements 200 in the parallel measurement.

Figures 7A, 7B:
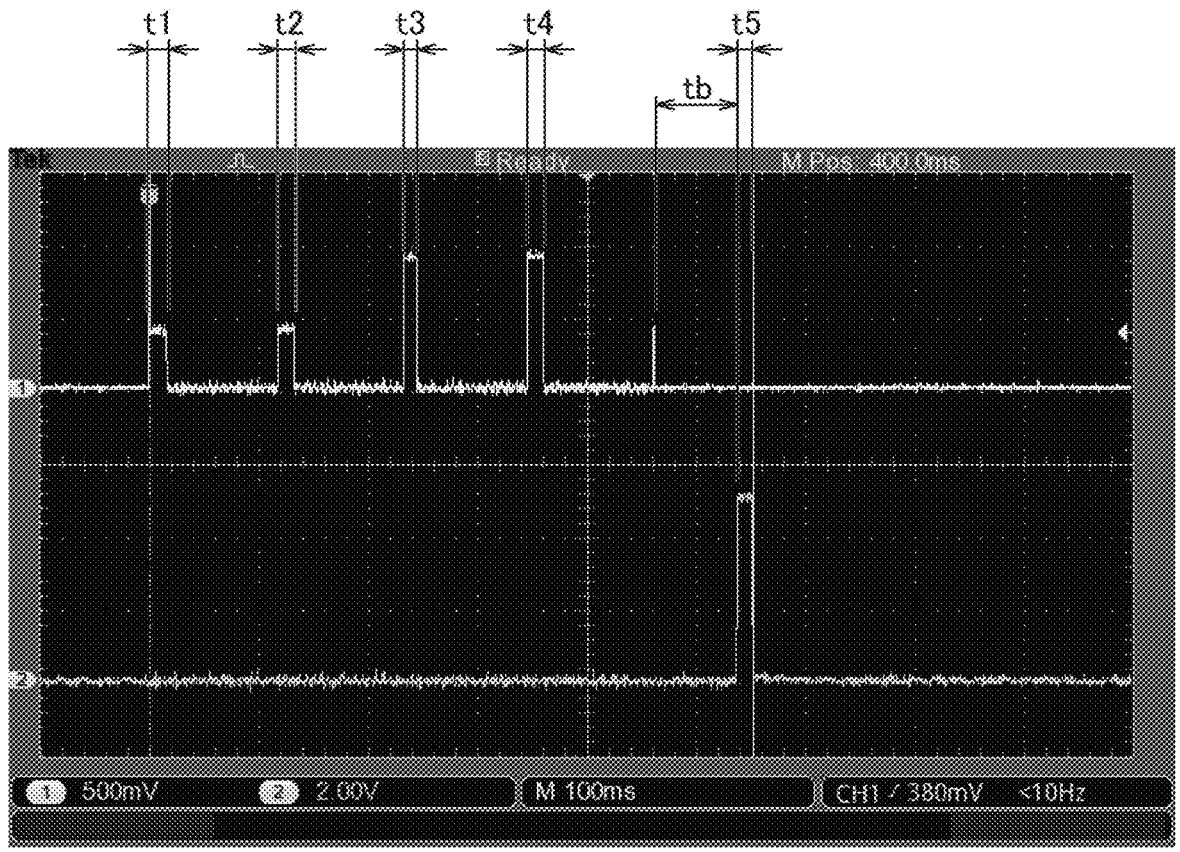
FIG. 7A is a graph showing an example of measurement time by the measurement system according to the first embodiment.
FIG. 7B is a table showing an example of measurement time by the measurement system according to the first embodiment.

FIGS. 7A and 7B show examples of measurement time of the optical semiconductor elements 200 using the measurement system 1 having 64 channels. The time t1 shown in FIG. 7A is the measurement time of the forward voltage Vf at the driving current I=4 mA. The time t2 is the measurement time of the optical output (IL) properties at the drive current I=4 mA. The time t3 is the measurement time of the forward voltage Vf at the drive current I=9 mA. The time t4 is the measurement time of the optical output (IL) properties at the drive current I=9 mA. The time t5 is the measurement time of the reverse current Ir. As shown in FIG. 7A, the sleep time is provided after the measurements of the forward voltage Vf and the optical output (IL) properties. The setting of the sleep time tr is particularly effective when the optical semiconductor elements 200 are liable to deteriorate due to local heating caused by energization.

The threshold current and slope efficiency of the optical semiconductor elements 200 can be calculated using the measurement data at the driving current I=4 mA and the measurement data at the driving current I=9 mA.

For example, as shown in FIG. 7B, each of the time t1 and the time t3 required for measuring the forward voltage Vf is 10 msec, and each of the time t2 and the time t4 required for measuring the optical output (IL) property is 13 msec. The measurement time ts required to measure one optical semiconductor element 200 in the serial measurement is 2 msec, which means that "tb=ts×64=128 msec". Each sleep time tr is 100 msec. That is, the total sleep time tr is 400 msec. Therefore, in the measurement shown in FIGS. 7A and 7B, the total measurement time required for the measurement of 64 optical semiconductor elements 200 is 574 msec.

Second Embodiment

Figure 8:
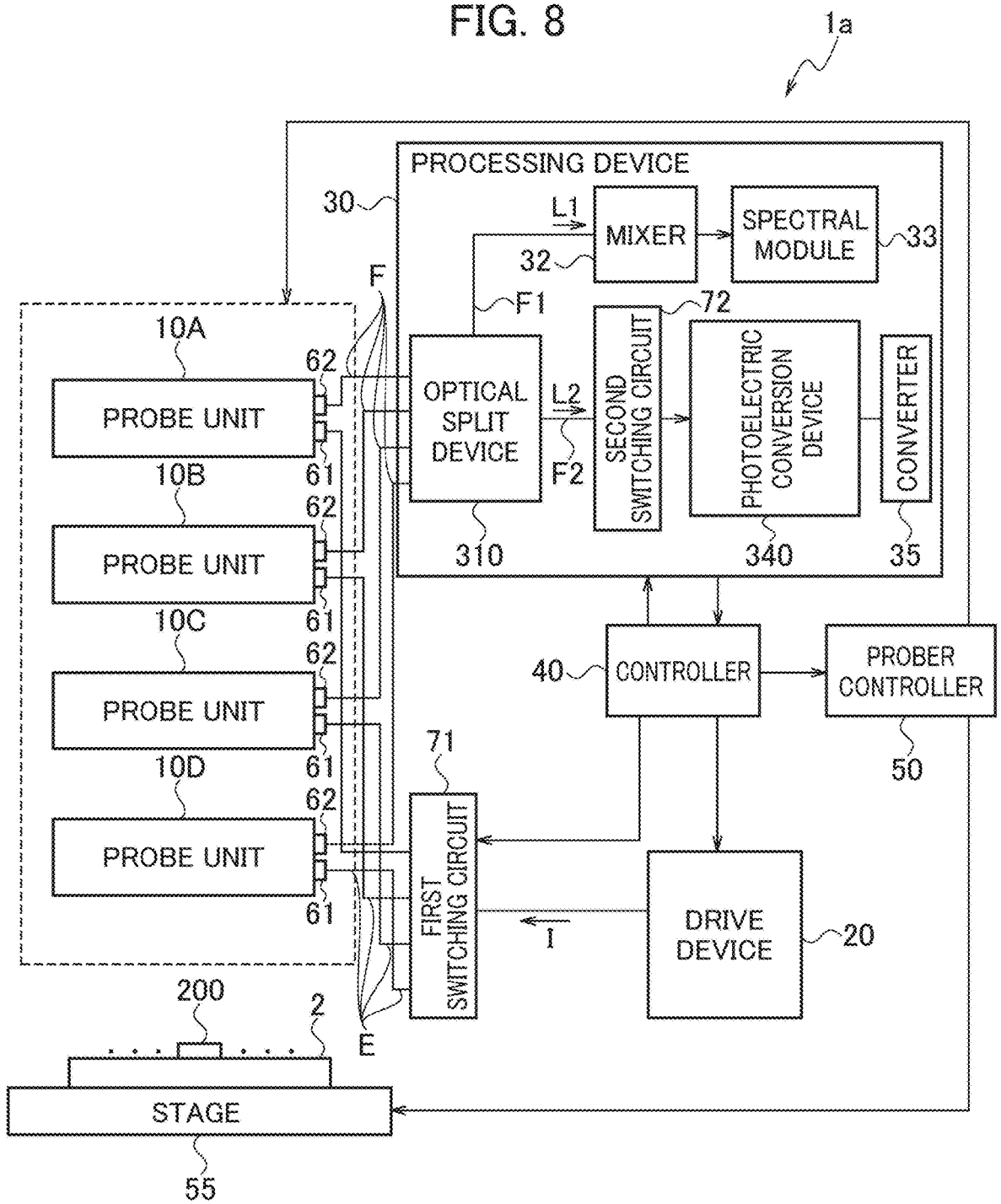
FIG. 8 is a schematic diagram showing a configuration of a measurement system according to a second embodiment.

As shown in FIG. 8, the measurement system 1a according to a second embodiment of the present invention includes a plurality of probe units 10. In the measurement system 1a, any one of the probe units 10A to 10D is connected to the drive device 20 and the photoelectric conversion device 340, and the emitted lights L of the optical semiconductor elements 200 are processed for each of the probe units 10. The measurement system 1a includes a first switching circuit 71 for switching the probe unit 10 connected to the drive device 20, and a second switching circuit 72 for switching the probe unit 10 connected to the photoelectric conversion device 340.

Although FIG. 8 shows a configuration in which the measurement system 1a includes four probe units 10, the number of probe units 10 provided in the measurement system 1a is not limited. In the following, the number of probe units 10 of the measurement system 1a is indicated by U.

By increasing the number of probe units 10, the number of optical probes 11 and electric probes 12 used for the measurement can be increased. According to the measurement system 1a, a single alignment between the probe unit 10 and the semiconductor substrate 2 increases the number of optical semiconductor elements 200 aligned with the optical probes 11 and the electric probes 12, thereby reducing the number of alignments.

The number of OE converters 34 and drivers 21 of the measurement system 1a shown in FIG. 8 is the same as those of the measurement system 1 shown in FIG. 1. Therefore, an increase in measurement cost and mounting space can be suppressed. In the measurement system 1a shown in FIG. 8, the electric probe 12 of any one of the probe unit 10A to the probe unit 10D is selectively connected to the drive device 20. Then, the optical probe 11 constituting a probe set with the selected electric probe 12 is connected to the photoelectric conversion device 340.

The first switching circuit 71 disposed between the probe unit 10A to the probe unit 10D and the drive device 20 may have, for example, the "m×n" number of analog switches. The input terminal of the analog switch is connected to the driver 21 of the drive device 20. The four output terminals of the analog switch are connected to the electric probes 12 of the probe units 10A to 10D. The "m×n" number of analog switches connect each of the "m×n" number of drivers 21 to each of the "m×n" number of electric probes 12. The electric probe 12 of any one of the probe units 10A to 10D is connected to the driver 21 by switching the analog switch.

The optical split device 310 of the measurement system 1a includes the "m×n×U" number of optical couplers 31 each corresponding to each of all the optical probes 11 included in the probe unit 10A to the probe unit 10D. The second switching circuit 72 disposed between the optical split device 310 and the photoelectric conversion device 340 optically connects the optical probe 11 and the OE converter 34 via the optical coupler 31 for each of the probe units 10.

The second switching circuit 72 may have, for example, the "m×n" number of optical switches. By switching the optical switch of the second switching circuit 72, the optical probe 11 of any one of the probe units 10A to 10D is connected to the OE converter 34 via the optical coupler 31. The four input terminals of the optical switch are connected to four optical couplers 31 connected to any one of the probe units 10A to 10D, and an output terminal of the optical switch is connected to one of the OE converters 34. The connection between the probe units 10 and the photoelectric conversion devices 340 is switched by the optical switch via the optical coupler 31. Thus, the "m×n" number of optical switches connect each of the "m×n" number of optical probes 11 to each of the "m×n" number of OE converters 34 via the optical couplers 31.

The switching operation in the first switching circuit 71 and the second switching circuit 72 is controlled by the controller 40. The parallel measurement is performed while the probe unit 10 connected to the drive device 20 and the photoelectric conversion device 340 is switched. In the serial measurement, the first split lights L1 from the "m×n×U" number of optical couplers 31 are input to the mixer 32 having the "m×n×U" number of input terminals, and the first split lights L1 are sequentially output from the output terminal of the mixer 32. Then, the spectral module 33 resolves the first split lights L1 outputted from the mixer 32.

For example, when the number of probe units 10 is U, the "m×n" number of optical switches having U×1 (U input(s), 1 output) are used in the second switching circuit 72. Further, the "m×n" number of analog switches having U×1, or the switching elements having equivalent functions may be used in the first switching circuit 71. Thus, the optical probe array 110 and the electric probe array 120 having m×n×U cores can be realized. The number of times that the optical switch or the analog switch is switched is (U−1).

The measurement time Tk1 performed by the measurement system having the U-number of probe units 10 is expressed by the following equation (2):

$$Tk1 = N \times \{tp + U \times ((tm + (m \times n) \times ts) + (U-1) \times tsw)\} \quad (2)$$

In equation (2), N is the number of repetitions of measurement when the number of the optical semiconductor elements 200 formed on the semiconductor substrate 2 is Nw. The number of repetitions N is expressed by Nw/(U×(m×n)). In equation (2), tp is the single alignment time, tm is the time required for the parallel measurement, and ts is the time required for the serial measurement. tsw is the switching time of the optical switch.

In the above example, the optical split device 310 having the "m×n×U" number of optical couplers 31 is used. However, the U-number of optical split devices 310 having the "m×n" number of optical couplers 31 may be used, and the probe unit 10 connected to the optical split device 310 may be switched by the optical switch. In addition, in the above example, the mixer 32 includes the "m×n×U" number of input terminals. However, the U-number of mixers 32 having the "m×n" number of input terminals may be used, and the mixer 32 connected to the optical split device 310 may be switched by the optical switch.

In the measurement of the optical semiconductor elements 200 by the measurement system 1a, the semiconductor substrate 2 or the probe unit 10 is moved every time the measurement of the "m×n×U" number of the optical semiconductor elements 200 is completed until all the optical semiconductor elements 200 formed on the semiconductor substrate 2 are measured. Then, the measurement described with reference to FIG. 6 is performed on the optical semiconductor elements 200 newly aligned with the probe unit 10.

As described above, in the measurement system 1a according to the second embodiment, the U-number (U is 2 or more) of probe units 10 including the optical probe array 110 and the electric probe array 120 is used. For this reason, according to the measurement system 1a, the number of optical probes 11 and electric probes 12 can be increased to U times the number of the measurement system 1 in FIG. 1, and the drive device 20 and the photoelectric conversion device 340 of the measurement system 1 in FIG. 1 can be used. Therefore, the expandability of the measurement system is easily performed. Furthermore, according to the measurement system 1a, the number of times of alignment between the optical semiconductor elements 200 and the probe unit 10 is reduced, which makes it possible to shorten the measurement time. The other parts of the measurement system 1a are substantially the same as those of the first embodiment, so that the redundant description is omitted. Hereinafter, the measurement system 1 and the measurement system 1a which have the probe unit 10 will be collectively referred to as "measurement system 1".

Figure 9:
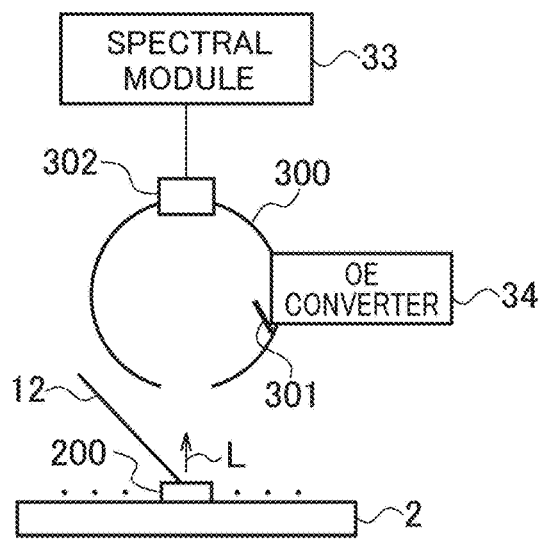
FIG. 9 is a schematic diagram showing a configuration of a measurement system in a comparative example.

Hereinafter, the measurement time is compared between the measurement system 1 and the measurement system of a comparative example shown in FIG. 9 (referred to below simply as "measurement system of comparative example").

In the measurement system of the comparative example, the optical semiconductor element 200 formed on the semiconductor substrate 2 is driven by the drive current supplied via the electric probe 12. The emitted light L from the optical semiconductor element 200 is received by an integrating sphere 300. The property of the emitted light L is measured using a measurement instrument such as the OE converter 34.

An opening is formed in the lower part of the integrating sphere 300, and the emitted light L from the optical semiconductor element 200 enters the inside of the integrating sphere 300 from the opening. The emitted light L is repeatedly reflected by the inner wall surface of the integrating sphere 300, and the incident intensities are averaged. By installing an OE converter such as a photodetector on the inner wall surface of the integrating sphere 300, the incident intensity corresponding to a predetermined area of the inner wall surface can be measured. The intensity of the emitted light L can be calculated by multiplying the incident intensities corresponding to the area of the inner wall surface of the integrating sphere 300. A light shielding plate 301 may be provided between the opening and the OE converter 34 so that the emitted light L does not directly irradiate the OE converter 34. The emitted light L entering a fiber collimator 302, which is disposed on the inner wall surface of the integrating sphere 300, is input to the spectral module 33 so that the spectral property of the emitted light L is measured.

In the measurement system of the comparative example, when there are the "m×n" number of optical semiconductor elements 200 in which the emitted lights L enter simultaneously inside the integrating sphere 300 at a fixed position, the measurement time Tk2 required for measurement of all the optical semiconductor elements 200 formed on the semiconductor substrate 2 is expressed by the following equation (3):

$$Tk2=N\times(tp+(m\times n)\times(tm+ts)) \quad (3)$$

In equation (3), N is the number of repetitions of measurement for the "m×n" number of optical semiconductor elements 200. The alignment time in one measurement is tp, the time required for measuring the photoelectric property is tm, and the time required for measuring the spectral property is ts. The "m×n" is the number of the optical semiconductor elements 200 capable of receiving the emitted lights L when the position of the integrating sphere 300 is fixed, and the "m×n" corresponds to the number of channels of the measurement system 1. In the measurement system of the comparative example, the measurement of the photoelectric properties by the OE converter 34 and the measurement of the spectral properties by the spectral module 33 can be performed simultaneously. In this case, if tm is ts or more, ts=0 in equation (3). However, in the measurement system of the comparative example, one each of the optical semiconductor elements 200 is measured.

On the other hand, the total measurement time Tk1 by the measurement system 1 is as shown in equation (2). When U, which is the number of probe units 10, is 1 and N, which is the number of repetitions of measurement, is the same in the measurement system 1 and the measurement system of the comparative example, Tk2−Tk1=(m×n−1)×tm. That is, when the measurement time is compared, the measurement time of the measurement system 1 is shorter by "(m×n−1)× tm" than that of the measurement system of the comparative example.

Figure 10:
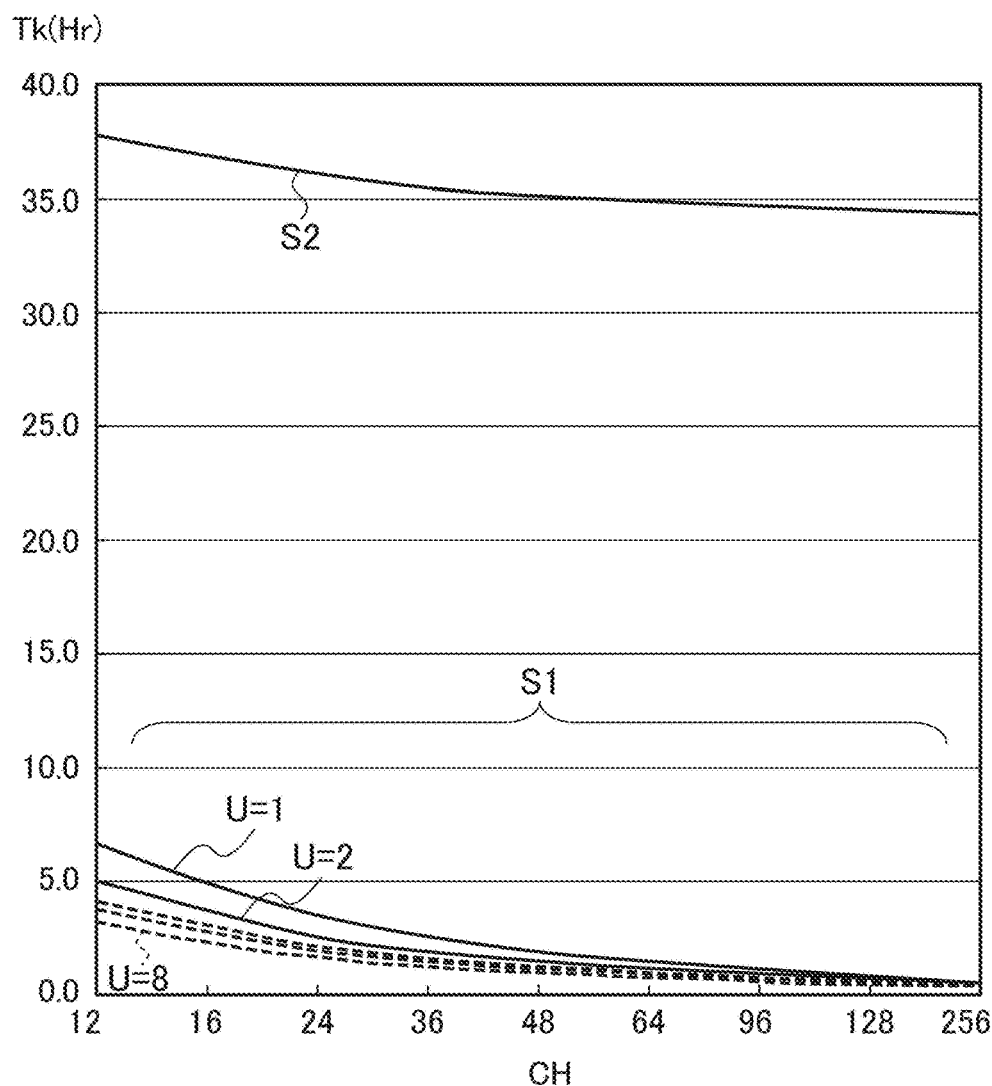
FIG. 10 is a graph showing a comparison of measurement time between the measurement system according to the embodiments and the measurement system of the comparative example.

FIG. 10 shows a comparison of measurement time between the measurement system 1 and the measurement system of the comparative example. In FIG. 10, a horizontal axis represents the number of channels CH, and a vertical axis represents the total measurement time Tk of the optical semiconductor elements 200 formed on the semiconductor substrate 2. The number of channels CH is "m×n×U". The number of the optical semiconductor elements 200 formed on the semiconductor substrate 2 is 153,544. The time required for measuring the photoelectric property is "tm=0.8 seconds", and the time required for measuring the spectral property is "ts=0.003 seconds". In addition, the alignment time is "tp=1.5 seconds", and the switching time of the optical switch is "tsw=0.006 seconds".

In FIG. 10, the properties S1 represent the measurement time when the measurement system 1 is used. In the properties S1, the number of probe units 10 is indicated by U (the same shall apply hereinafter). The properties S2 represent the measurement time when the measurement system of the comparative example is used.

As shown in FIG. 10, in the measurement system of the comparative example, the measurement time is substantially constant when m×n is 48 or more. As is clear from FIG. 10, by using the measurement system 1, the measurement time of the optical semiconductor elements 200 can be significantly shortened as compared with the measurement system of the comparative example.

FIG. 11 is an enlarged graph of the measurement time Tk by the measurement system 1 shown in FIG. 10. When U (the number of probe units 10) is large, the switching time of the optical switch or the analog switch is included in the measurement time Tk. However, as shown in FIG. 11, the larger U (the number of probe units 10) is, the shorter the measurement time Tk is.

For example, in the case of the probe unit 10 that is U=1 and ""m×n"=12 cores, the measurement time Tk is 8 hours. On the other hand, in the case of the probe unit 10 that is U=1 and "m×n"=48 cores, the measurement time Tk is about 2 hours, which is ¼ hours in comparison with the probe unit 10 having 12 cores. In addition, if it is desired to reduce the number of channels so that the measurement time Tk is about 2 hours, the four probe units 10 having "m×n"=24 cores may be used.

As described above, according to the measurement system 1, by repeatedly measuring the optical semiconductor elements 200 formed on the semiconductor substrate 2 by "m×n×U" numbers each, the optical semiconductor elements 200 formed on the semiconductor substrate 2 can be measured in a short time. Since the measurement time of the optical semiconductor elements 200 can be greatly shortened, it is possible to judge whether each of the optical semiconductor elements 200 is non-defective or defective by comparing the measured values of all the optical semiconductor elements with the required specifications. Therefore, a yield rate when the optical semiconductor elements 200 are mounted in a module can be improved. Further, by increasing the number of cores of the optical probes 11 and the electric probes 12 due to an increase of the number of probe units 10, the measurement time can be shortened. At this time, by selecting one probe unit 10 from the plurality of probe units 10 with the optical switch or the analog switch, it is possible to suppress an increase in the size of the measurement system 1 and to easily perform the expandability of the measurement system 1.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

In the above description, a configuration example of the optical probe array 110 is described by arranging the multicore probes having n-cores in "m" columns, but the optical probe array 110 may be configured by arranging the multicore probes having m-cores in "n" columns. Also, one driver 21 may supply the drive currents to the plurality of electric probes 12. Thus, the cost and mounting space of the measurement system can be suppressed. For example, one driver 21 may supply the drive currents to the "m×n" number of optical semiconductor elements 200 for performing the parallel measurement.

Although the multicore optical probe array 110 having the "m×n" cores is shown in an optical fiber or a waveguide configuration as the optical connection device, the optical probe array 110 may be arranged in other configurations. For example, it is also possible to configure the optical connection device by arranging the "m×n" number of integration spheres above the wafer and arranging the integration spheres at a certain distance apart from each other. In this case, the "m×n" number of cores is reduced; however, as for the optical split device 310, since the ends of both the OE converter and the spectroscopic equipment are included in the integrating sphere, the configuration of the processing device 30 is simplified. In addition, since an area of the opening hole of the integrating sphere can be increased, it is possible to measure the large-sized optical semiconductor elements 200. When the size of the optical semiconductor elements 200 is small, the emitted lights L from the plurality of optical semiconductor elements 200 can enter the inside of the integrating sphere. Therefore, the plurality of optical semiconductor elements 200 can be sequentially measured in one installation state in which neither the semiconductor substrate 2 nor the probe unit 10 moves.

As described above, it is natural that the present invention incorporates a variety of embodiments which are not described herein. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A measurement system for measuring properties of optical semiconductor elements arranged in an "m×n" array, the measurement system comprises:
    a drive device configured to drive a plurality of optical semiconductor elements arranged in an "m×n" array, where m and n are both greater than one;
    a probe unit including a plurality of optical connection devices arranged in an "m×n" array, wherein each of the plurality of optical connection devices is configured to receive emitted light generated by a respective one of the plurality of optical semiconductor elements, and the probe unit including a plurality of electric probes arranged in an "m×n" array, wherein the electric probes are arranged corresponding to the optical connection devices arranged in an "m×n" array, respectively, and wherein the drive device includes a plurality of drivers each corresponding to a respective one of the electric probes; and
    a processing device including an "m×n" number of photoelectric converters corresponding to the plurality of optical connection devices arranged in an "m×n" array; wherein:
    the number of optical semiconductor elements is the same as the number of optical connection devices, the number of electric probes, the number of drivers, and the number of photoelectric converters, such that each of the optical connection devices, the electric probes, the drivers, and the photoelectric converters correspond to a respective one of the optical semiconductor elements;
    the drivers supply drive current to the optical semiconductor elements simultaneously via the electric probes so that all of the optical semiconductor elements are energized to emit lights simultaneously;
    each of the plurality of optical connection devices is optically connected to a corresponding one of the "m×n" number of photoelectric converters, such that each of the "m×n" number of photoelectric converters receives as an input at least some of the emitted light propagated by a corresponding one of the plurality of optical connection devices;
    each of the "m×n" number of photoelectric converters converts light signals received as input into corresponding electric signals; and
    the plurality of optical semiconductor elements arranged in an "m×n" array are simultaneously measured.

2. The measurement system according to claim 1, wherein the processing device includes:
    an optical split device configured to split the respective emitted lights received by each of the "m×n" number of optical connection devices into first split lights and second split lights; and
    a spectral module configured to resolve the first split light; wherein
    the spectral module sequentially resolves one each of the first split lights of the respective emitted lights received by the "m×n" number of optical connection devices.

3. The measurement system according to claim 2, wherein:

the optical split device includes a plurality of optical couplers corresponding to the "m×n" number of optical connection devices; and each of the plurality of optical couplers splits the emitted light received by its corresponding optical connection device into a respective first split light and a respective second split light.

4. The measurement system according to claim 2, wherein the second split light is input to the "m×n" number of photoelectric converters.

5. The measurement system according to claim 1, wherein each of the plurality of optical connection devices is an optical probe in which the emitted light enters a tip of the optical probe.

6. The measurement system of claim 1, wherein each of the plurality of optical connection devices is an integrating sphere in which the emitted light enters an inside of the integrating sphere.

7. The measurement system according to claim 1, further comprising a plurality of instances of the probe unit, wherein a connection between any one of the plurality of instances of the probe unit and the drive device is switched so that the emitted lights are processed for each of the plurality of instances of the probe unit.

* * * * *